US005487962A

United States Patent [19]
Rolfson

[11] Patent Number: 5,487,962
[45] Date of Patent: Jan. 30, 1996

[54] METHOD OF CHROMELESS PHASE SHIFT MASK FABRICATION SUITABLE FOR AUTO-CAD LAYOUT

[76] Inventor: J. Brett Rolfson, 6225 HolliLynn, Boise, Id. 83704

[21] Appl. No.: 240,994

[22] Filed: May 11, 1994

[51] Int. Cl.⁶ ..................................................... G03F 9/00
[52] U.S. Cl. .............. 430/5; 430/312; 430/313; 430/314
[58] Field of Search ................. 430/5, 312, 313, 430/314

[56] References Cited

U.S. PATENT DOCUMENTS

| | | | |
|---|---|---|---|
| 5,079,113 | 1/1992 | Ohta et al. | 430/5 |
| 5,126,220 | 6/1992 | Tokitomo et al. | 430/5 |
| 5,153,083 | 10/1992 | Garofalo et al. | 430/5 |
| 5,194,344 | 3/1993 | Cathey et al. | 430/5 |
| 5,194,346 | 3/1993 | Rolfson et al. | 430/5 |
| 5,208,125 | 5/1993 | Lowrey et al. | 430/5 |
| 5,217,830 | 6/1993 | Lowrey | 430/5 |
| 5,225,035 | 7/1993 | Rolfson | 156/643 |
| 5,240,796 | 8/1993 | Lee et al. | 430/5 |
| 5,281,500 | 1/1994 | Cathey et al. | 430/5 |
| 5,288,568 | 2/1994 | Cathey, Jr. | 430/5 |
| 5,292,623 | 3/1994 | Kemp et al. | 430/313 |

FOREIGN PATENT DOCUMENTS

| | | | |
|---|---|---|---|
| 3-172845 | 7/1991 | Japan | G03F 1/08 |
| 4-254855 | 9/1992 | Japan | . |

OTHER PUBLICATIONS

Lin, Burn J., "Phase Shifting and Other Challenges in Optical Mask Technology", IBM-EF-15 (Sep. 26, 1990).

*Primary Examiner*—S. Rosasco

[57] ABSTRACT

A method for forming chromeless phase shifting photomasks is provided. The photomasks include a transparent substrate and raised phase shifters formed with a vertical edge and a tapered edge. During a lithographic process using the photomask, the vertical edges of the phase shifters form nulls on a photoresist covered wafer. The tapered edge prevents the formation of undesirable stringers on the wafer. The method of the invention includes the steps of: forming an opaque etch mask including a pattern of opaque features on a transparent substrate; forming a layer of resist over one sidewall of each opaque feature; and then etching the photoresist with one etching species and the substrate with another etching species to form chromeless phase shifters each having a vertical edge and a tapered edge.

20 Claims, 4 Drawing Sheets

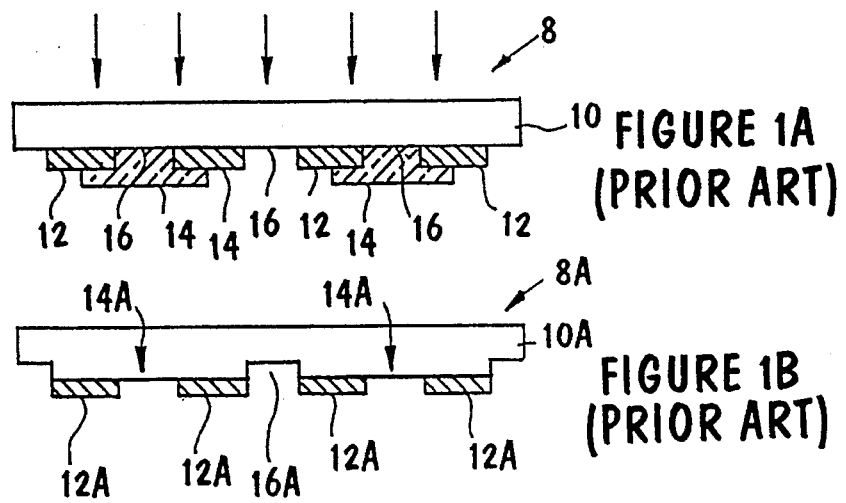
FIGURE 1A (PRIOR ART)
FIGURE 1B (PRIOR ART)
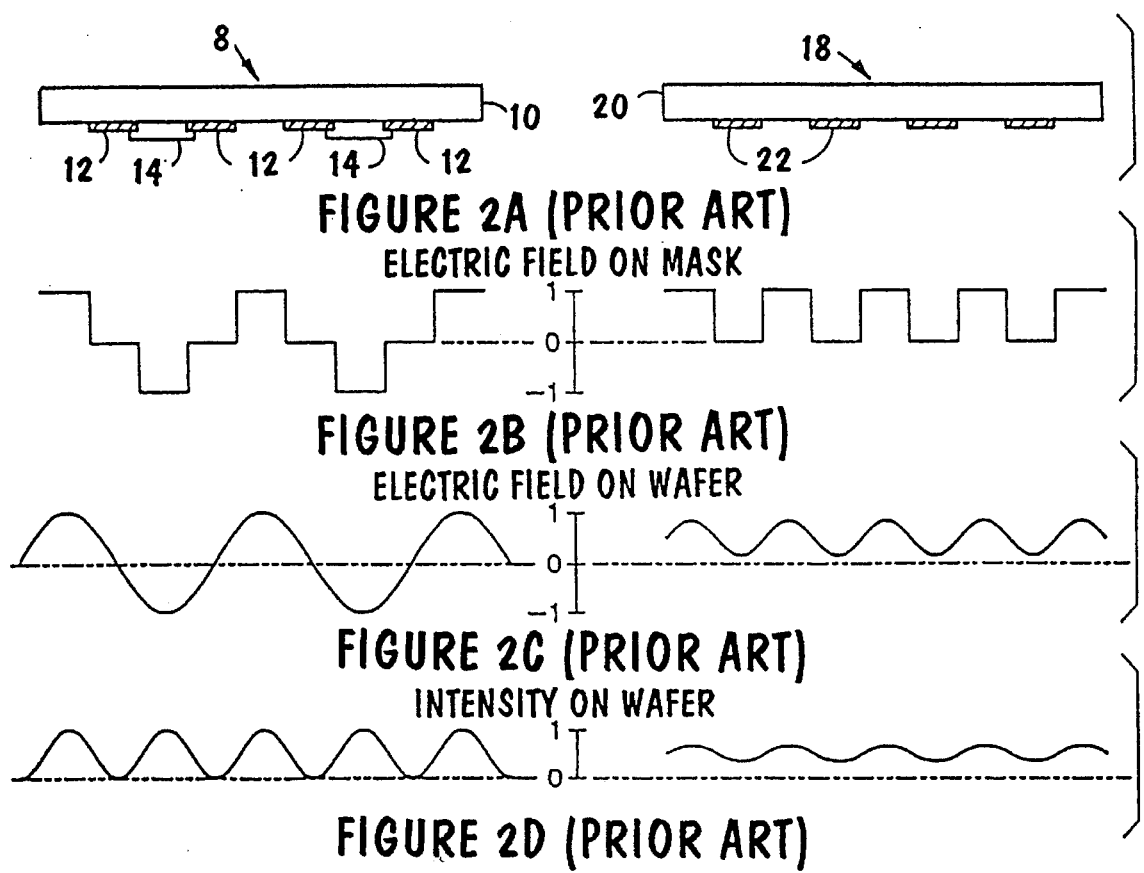
FIGURE 2A (PRIOR ART)
FIGURE 2B (PRIOR ART) ELECTRIC FIELD ON MASK
FIGURE 2C (PRIOR ART) ELECTRIC FIELD ON WAFER
FIGURE 2D (PRIOR ART) INTENSITY ON WAFER

METHOD OF CHROMELESS PHASE SHIFT MASK FABRICATION SUITABLE FOR AUTO-CAD LAYOUT

FIELD OF THE INVENTION

This invention relates to optical lithography and more particularly to the fabrication of photomasks or reticles which are used in optical lithography. The method of the invention is particularly suited to the fabrication of phase shifting photomasks for semiconductor manufacture.

BACKGROUND OF THE INVENTION

In semiconductor manufacture, micro lithography is used in the formation of integrated circuits on a semiconductor wafer. During a lithographic process, a form of radiant energy such as ultraviolet light, is passed through a photomask or reticle and onto the semiconductor wafer. The photomask contains opaque and transparent regions formed in a predetermined pattern. A grating pattern, for example, may be used to define parallel spaced conducting lines on a semiconductor wafer. The ultraviolet light exposes the mask pattern on a layer of resist formed on the wafer. The resist is then developed for removing either the exposed portions of resist for a positive resist or the unexposed portions of resist for a negative resist. The patterned resist can then be used during a subsequent semiconductor fabrication process such as ion implantation or etching.

As microcircuit densities have increased, the size of the features of semiconductor devices have decreased to the sub micron level. These sub micron features may include the width and spacing of metal conducting lines or the size of various geometric features of active semiconductor devices. The requirement of sub micron features in semiconductor manufacture has necessitated the development of improved lithographic processes and systems. One such improved lithographic process is known as phase shift lithography.

With phase shift lithography the interference of light rays is used to overcome diffraction and improve the resolution and depth of optical images projected onto a target. In phase shift lithography, the phase of an exposure light at the object is controlled such that adjacent bright areas are formed preferably 180 degrees out of phase with one another. Dark regions are thus produced between the bright areas by destructive interference even when diffraction would otherwise cause these areas to be lit. This technique improves total resolution at the object and allows resolutions as fine as 0.25 μm to occur.

In general, a phase shifting photomask is constructed with a repetitive pattern formed of three distinct layers or areas. An opaque layer provides areas that allow no light transmission, a transparent layer provides areas which allow close to 100% of light to pass through and a phase shift layer provides areas which allow close to 100% of light to pass through but phase shifted 180 degrees from the light passing through the transparent areas. The transparent areas and phase shift areas are situated such that light rays diffracted through each area is canceled out in a darkened area there between. This creates the pattern of dark and bright areas which can be used to clearly delineate features of a pattern defined by the opaque layer of the mask on a photopatterned semiconductor wafer.

Recently, different techniques have been developed in the art for fabricating different types of phase shifting photomasks. One type of phase shifting mask, named after a pioneer researcher in the field, M. D. Levenson, is known in the art as a "Levenson" phase shifting mask. This type of mask is also referred to as an "alternating aperture" phase shifting mask because opaque light blockers alternate with light transmission apertures and every other aperture contains a phase shifter.

This type of mask is typically formed on a transparent quartz substrate. An opaque layer, formed of a material such as chromium, is deposited on the quartz substrate and etched with openings in a desired pattern. Phase shifting areas on the mask are formed by depositing a phase shifting material over the opaque layer and into every other opening in the opaque layer. This is termed an "additive" phase shifting mask. Alternately, phase shifting areas of the mask may be formed in areas of the quartz substrate having a decreased thickness. This is termed a "subtractive" phase shifting mask.

Two types of Levenson phase shifting photomasks are shown in FIGS. 1A and 1B. FIG. 1A shows an additive phase shifting mask 8 comprising a transparent substrate 10 and opaque light blockers 12 with light transmission openings 16 therebetween. The phase shifters 14 for the phase shifting mask 8 are formed as segments of a light transmissive material, such as $SiO_2$, deposited in every other light transmissive opening 16.

FIG. 1B shows a subtractive phase shifting mask 8A. In a subtractive phase shifting mask 8A, the phase shifters 14A are formed by etching the substrate 10A aligned with every other light transmission opening 16A in the opaque layer 12A. In the subtractive phase shifting mask 8A, the unetched portions of the substrate 10A form the phase shifters 14A. Although the additive and subtractive phase shifting masks are fabricated by different methods, the operation of these photomasks is equivalent.

The operation of the phase shifting mask 8 contrasted with the operation of a conventional photomask 18 formed with a transparent substrate 20 and opaque light blockers 22, is shown in FIGS. 2A–2D. FIG. 2B shows the electric field on the mask 8. FIG. 2C shows the electric field on the wafer. FIG. 2D shows the intensity on the wafer.

As shown in FIG. 2B, the phase shifters 14 create a "−1" amplitude on the wafer. This effectively reduces the spatial frequency of the electric field so that it is less inhibited by the lens transfer function of the imaging system and forms a higher contrast amplitude image at the wafer plane. When the electric field is recorded by the photoresist, only the intensity that is proportional to the square of the electric field amplitude is recorded. This doubles the reduced spatial frequency and produces an image of much higher contrast. In addition to the reduction of spatial frequency, the electric field is forced to pass through zero to −1. Thus edge contrast is improved. Therefore, the alternating phase shifting system benefits from the reduction of spatial frequencies as well as the enhancement of edge contrast.

Another type of phase shifting photomask is known in the art as a chromeless phase shifting mask. In a chromeless phase shifting mask there are no opaque (e.g., chrome) areas. Rather the edges between the phase shift areas and light transmission areas on the mask form a pattern of dark lines on the wafer. This is shown in FIGS. 3A–3D. A chromeless phase shifting mask 24 includes a transparent substrate 26 with a raised phase shifting area 28. The raised phase shifting area 28 may be formed by an additive or a subtractive process.

In the chromeless phase shifting mask 24 the edge 30 of the raised phase shifting area 28 prints a narrow dark line on the wafer. The amplitude passing through zero insures a zero intensity. The dark line is extremely narrow and has a much higher contrast in comparison to a dark line produced by a narrow opaque object without phase shifting.

One problem that occurs with a chromeless phase shifting mask 24 is that the raised phase shifting area 28, viewed from above, also has a terminating edge at each end. Such a terminating edge will form an undesirable "stringer" on the wafer. This is shown in FIGS. 4A and 4B. FIG. 4A is a plan view of a portion of the chromeless phase shifting mask 24 shown in FIG. 3A. FIG. 4B is a plan view the photoresist pattern formed at the wafer. The raised phase shifting area 28 of the photomask 24 includes the edges 30 that produce dark lines or "runners" 30A (FIG. 4B) on the photoresist.

In a similar manner, a terminating edge 32 of the raised phase shifting area 28 produces a stringer 32A on the photoresist. This stringer 32A is not a part of the desired pattern, and if not corrected, may cause shorting in the completed semiconductor devices. As will be apparent to those skilled in the art depending on the layout of a desired wafer pattern, stringers may occur in numerous other situations. As an example, a chromeless phase shifting area may change directions and connect or disconnect with other features on a wafer pattern.

In view of the foregoing, there is a need in the art for improved methods for forming chromeless phase shifting photomasks. Accordingly, it is an object of the present invention to provide an improved method for forming chromeless phase shifting photomasks and for eliminating undesirable null formation at the terminating edges of chromeless phase shifters. It is a further object of the present invention to provide an improved method for forming chromeless phase shifting photomasks that is simple and compatible with auto-CAD layout techniques used in semiconductor manufacture.

SUMMARY OF THE INVENTION

In accordance with the present invention, an improved method of forming chromeless phase shifting photomasks (or masks) is provided. The method of the invention is particularly suitable for lay out and generation of mask patterns using auto CAD techniques. In the chromeless phase shifting mask, raised transparent phase shifters are formed on a transparent substrate. The phase shifters include one vertical edge that prints as a null on the wafer and one tapered edge that prevents null formation at the ends of the pattern. The vertical edge and tapered edge are etched simultaneously into the transparent substrate using a dry etch process.

Initially, a pattern of opaque features is formed on the transparent substrate. One sidewall of each opaque feature is then covered with photoresist and the other sidewall is left exposed. During a dry etch process, an etchant species such as $O_2$ or $O_2/N_2$ is used to isotropically etch the photoresist. In a similar manner, a fluorine based etchant species such as $SF_6$, $CF_4$ or $CHF_3$ is used to etch the transparent substrate. If the different etchant species are used in sequence, the tapered edge is formed as a stair step. If the different etchant species are combined, the tapered edge is formed as a smooth surface rather than as a stair step. In either case, at the same time the tapered edge is formed in the substrate, a vertical edge is formed in the substrate along the exposed sidewall of the opaque feature. Following the dry etch process, the opaque features are stripped to expose raised chromeless phase shifters having a vertical edge and a tapered edge.

In use of the phase shift mask, during photopatterning of a semiconductor wafer, the electric field intensity produced by the tapered edge is spread out due to the point spread function of the imaging system. The tapered edge thus does not produce an image on the wafer. Because the ends or terminating edges of the chromeless phase shifters, as viewed from the top, are also formed with a tapered edge, undesirable stringers are not printed on the wafer. The desired pattern is carried totally by the vertical edges of the phase shifters.

In an alternate embodiment, the method of the invention may also be used to pattern a semiconductor wafer with dark lines having different widths. In the alternate embodiment selected, opaque features initially formed on the transparent substrate are left to form opaque light blockers for the completed photomask. The opaque light blockers print as a wide line on the wafer and the vertical edge of the phase shifters print as a narrow line.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 1A is a cross sectional view of a prior art phase shifting photomask constructed with an additive process;

FIG. 1B is a cross sectional view of a prior art phase shifting photomask constructed with a subtractive process;

FIGS. 2A–2D are combined cross sectional views of a conventional and phase shifted photomask, with accompanying plots showing the electric field and intensity on the mask and wafer during a photopatterning process;

DETAILED DESCRIPTION OF THE PREFERRED EMBODIMENTS

Figure 3A:
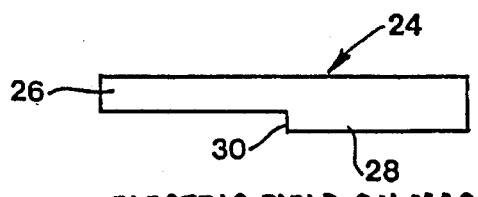
FIGS. 3A–3D are combined cross sectional views of a portion of a chromeless phase shifting mask, with accompanying plots showing the electric field and intensity on the mask and wafer during a photopatterning process.
Figure 3B:
Figure 3C:
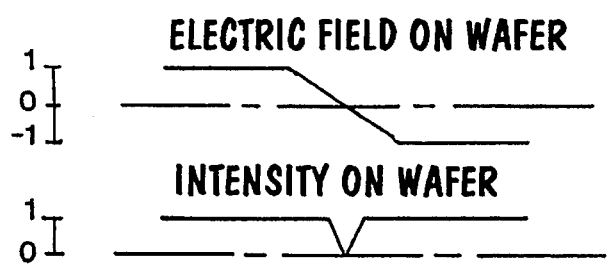
Figure 3D:
Figure 4A:
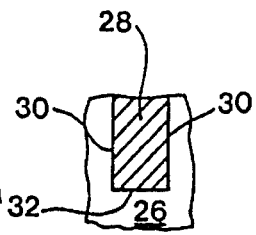
FIG. 4A is a plan view of a prior art chromeless phase shifting mask showing a terminating edge of a chromeless phase shifter.
Figure 5A:
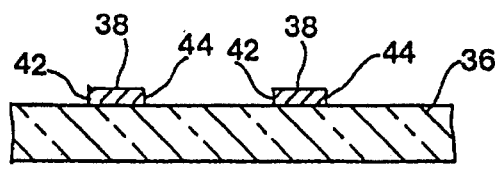
FIGS. 5A–5D are cross sectional views illustrating the steps involved in fabricating a phase shifting mask in accordance with the invention.
Figure 4B:
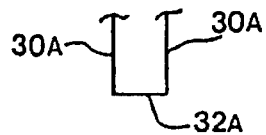
FIG. 4B is a plan view of the pattern printed on a semiconductor wafer by the phase shifting mask of FIG. 4A illustrating the formation of an undesirable stringer.

As used herein, the terms "mask" and "photomask" are interchangeable. Referring now to FIG. 5A, initially opaque features 38 are formed on a transparent substrate 36. In an illustrative embodiment the transparent substrate 36 is formed of quartz. Quartz is typically utilized as the mask substrate in optical projection systems. Alternately the substrate 36 may be formed of other transparent materials having suitable optical and mechanical properties.

The opaque features 38 are formed of material such as chrome. Other opaque materials such as aluminum, iron oxide, gold, tungsten or others may also be utilized. Such an opaque material may be deposited onto the transparent substrate 36 by conventional processes such as sputtering, chemical-vapor deposition (CVD) or electron beam deposition (EBD) and patterned to form the opaque features 38. This step of the process wherein the opaque features 38 are patterned is termed herein as the "first write".

The opaque features 38 are spaced apart by a predetermined distance and have vertical sidewalls 42, 44 that are generally perpendicular to the plane of the transparent substrate 36. Viewed from above (i.e., plan view) the opaque features 38 are formed in the pattern shown in FIG. 9A. As is readily apparent, this pattern is merely exemplary and other patterns could also be utilized.

Figure 5B:
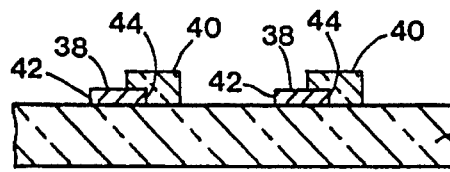

Next, as shown in FIG. 5B, a layer of photoresist 40 is deposited on the opaque features 38. The layer of photoresist 40 is written and developed such that one sidewall 42 of each opaque feature 38 is exposed but the other sidewall 44 is covered by the layer of photoresist 40. The patterned layer of photoresist 40, in addition to covering one sidewall 44 of the opaque feature 38, also covers each end or terminating edge (not shown) of the opaque features 38. This step of the process wherein the photoresist pattern is formed is termed herein as the "second write".

Figure 5C:
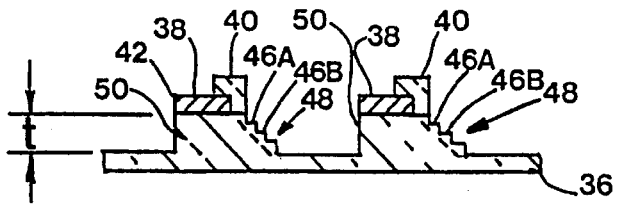

Next, as shown in FIG. 5C, the substrate 36 is isotropically etched using a fluorine based etching species such as $SF_6$, $CF_4$ or $CHF_3$. Then the photoresist is isotropically etched using an $O_2$ or $O_2/N_2$ etching species. This forms a small stair step 46A. Other etching species besides fluorine based gases that are suitable for dry etching quartz may also be utilized. The etching species for etching the quartz substrate 36 however, must be selected to not attack the opaque features 38. Following formation of the stair step 46A, another stair step 46B is formed using the same sequential process. This process is repeated several times to create a succession of stair steps to form a tapered edge 48.

The slope of the tapered edge 48 is set at an angle shallow enough such that in using a photomask constructed in accordance with the invention, the point spread function of the imaging system does not print an image on the wafer. For a typical imaging system and photolithography process, the slope is set at an angle less than forty-five degrees.

Alternately in place of isotropically etching the photoresist 40 and the substrate 36 separately in sequence, these etch steps can be performed simultaneously by combining the etching species. In this case the oxygen containing species attacks primarily the photoresist 40 and the fluorine containing species attacks primarily the substrate 36. This would produce a smooth edge as indicated by the dashed lines in FIG. 5C adjacent to the stairsteps 46A, 46B. A desired slope for the smooth edge can be achieved by controlling the ratio of the etching species during the etching step. Again, for a typical imaging system the angle of the slope is less than 45°.

At the same time that the tapered edges 48 are formed by sequentially (or simultaneously) etching the photoresist 40 and the quartz substrate 36, vertical edges 50 (FIG. 5C) are formed in the substrate 36 adjacent to the exposed sidewalls 42 of the opaque features 38. The vertical edges 50 are not protected by the photoresist 40 and are thus defined by the exposed sidewall 42 of the opaque features 38.

Figure 5D:
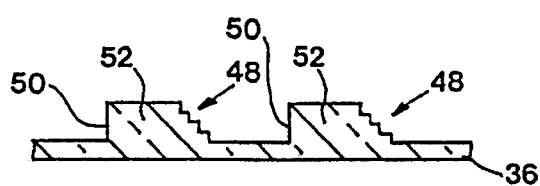

The depth of the etch into the substrate 36 measured from the surface of the substrate 36 to the bottom of the vertical edge 50 determines the thickness "t" of the completed phase shifters 52 (FIG. 5D). The optimal thickness for achieving a 180° ($\pi$) phase shift may be determined by the formula:

t=i$\lambda$/2(n-1)

where t=depth of the etch measured from the top of the substrate 36 to the bottom of the vertical edge 50 i=an odd integer $\lambda$=wavelength of exposure light n=refractive index of substrate at the exposure wavelength Next, as shown in FIG. 5D, the photoresist 40 is stripped using a suitable wet chemical such as sulfuric acid and hydrogen peroxide or an organic mixture such as ST-22 from ASCI. Following the photoresist strip, the opaque features 38 are stripped using a suitable wet chemical etch. For chrome opaque features 38 a wet chrome etch can be performed using Cyantek CR-7S. Chrome opaque features 38 can also be plasma etched using a $Cl_2/O_2$ chemistry. In either case, raised chromeless phase shifters 52 are formed on the substrate 36 each having a vertical edge 50 and a tapered edge 48.

Figure 6A:
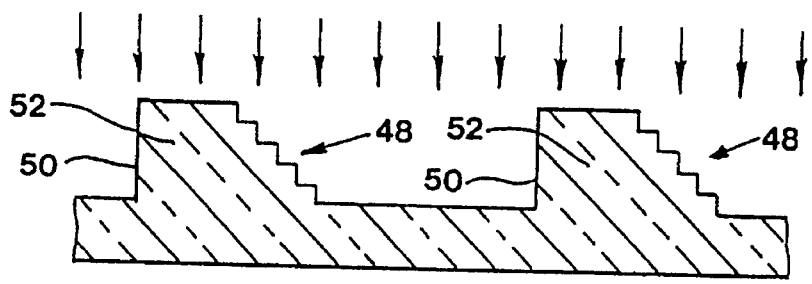
FIGS. 6A–6B are schematic cross sectional views illustrating a photomask constructed in accordance with the invention in use during a photopatterning process.
Figure 6B:
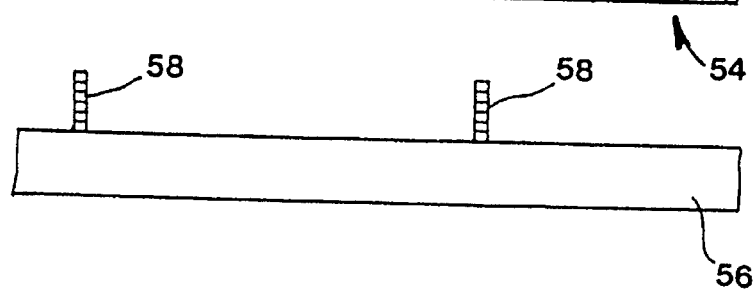

FIGS. 6A and 6B illustrate a chromeless phase shift mask 54 having chromeless phase shifters 52 formed in accordance with the invention in use for photopatterning a semiconductor wafer 56. During a photolithography process light rays are directed through the phase shift mask 54 at the semiconductor wafer 56. The vertical edges 50 of the phase shifters 52 form intensity nulls on the wafer. If the wafer 56 is covered with a positive resist, these nulls print dark lines 58. The dark lines 58 are extremely narrow and are formed with a high contrast. The tapered edges 48 of the phase shifters 52 do not print on the wafer 56 because the null is spread out by the point spread function of the imaging system. In addition, since the tapered edges wrap around the ends of the phase shifters 52, undesirable stringers are not formed by the terminating edges of the phase shifters 52.

Figure 9A:
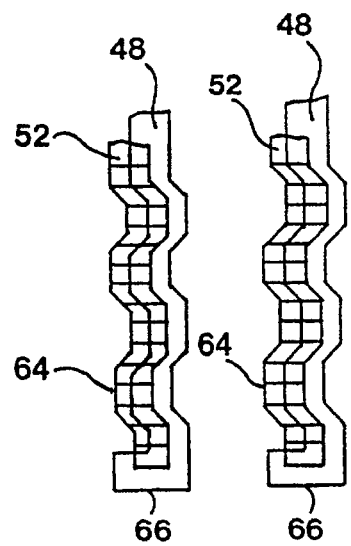
FIG. 9A is a plan view of a pattern formed during a first write and during a second write for a phase shifting photomask formed in accordance with the invention.
Figure 9B:
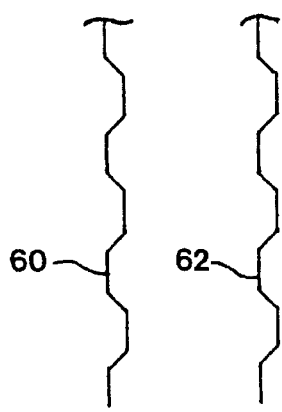
FIG. 9B is a plan view of the pattern that is printed on a semiconductor wafer using the photomask pattern of FIG. 9A.

FIG. 9A illustrates the pattern of the chromeless phase shifters 52 in a plan view for forming parallel spaced runners 60, 62 (FIG. 9B) on the wafer 56. In FIG. 9A the phase shifters 52 are represented by the cross hatched area 64. The tapered edges 48 (FIG. 5C) are represented by the oversized area 66 that overlaps the cross hatched area 64. As shown in FIG. 9A, the tapered edges 48 overlap the ends of the pattern of the phase shifters 52. This forms caps on the phase shifters 52 and prevents the formation of undesirable stringers 32A (FIG. 5B) between the runners 60, 62.

Such a layout lends itself to auto CAD (computer assisted design) layout techniques that are used in the art. Masks are normally laid out using auto CAD techniques. Phase shifting masks, however, are more difficult to lay out using auto CAD because the complex geometries produce phase conflicts and undesirable interactions. For this reason trial and error techniques are often employed in phase shift mask layout. With the present method, on the other hand, one skilled in the art of mask making can write a simple algorithm to convert a mask layout to a phase shifting layout. The simplicity of the phase shift pattern produced by the present invention makes it suitable for auto-CAD layout techniques.

Figure 7A:
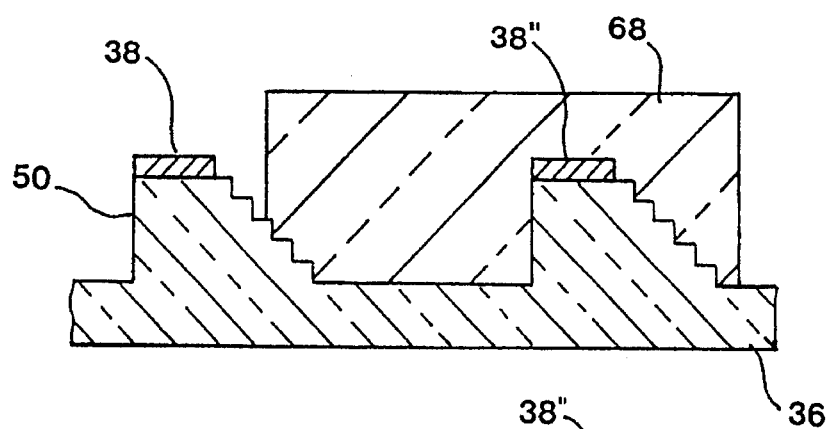
FIGS. 7A–7B are schematic cross sectional views of the steps involved in fabricating a phase shifting mask in accordance with an alternate embodiment of the invention.
Figure 7B:
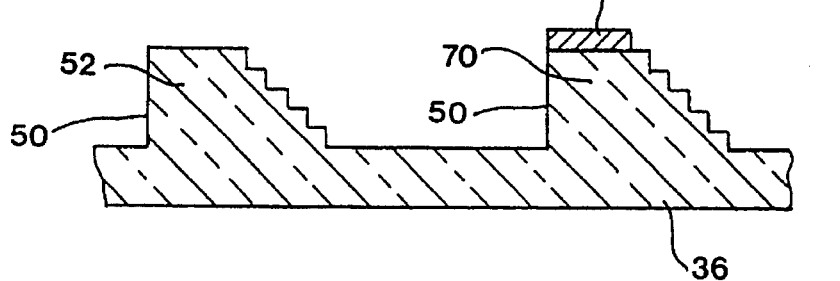

Referring now to FIGS. 7A and 7B, the method of the invention can also be used to form features having different widths. The process is the same as described above in FIGS. 5A–5C. However, after the resist 40 is stripped the chrome features 38 are left on the substrate 36. As shown in FIG. 7A, another layer of resist is deposited, written using a "third write" and then developed to form a patterned layer of resist 68. The layer of resist 68 covers selected opaque features 38'. The other opaque features 38 are left exposed.

Next, as shown in FIG. 7B, the exposed opaque features 38 are stripped using a wet chrome etch as previously described. (Alternately a dry plasma etching process as previously described can be used to remove the opaque features 38.) The wet chrome etch is followed by a resist strip in which the layer of resist 68 is stripped. This leaves a pattern of chromeless phase shifter 52 and phase shifters 70 topped by an opaque feature 38.

Figure 8A:
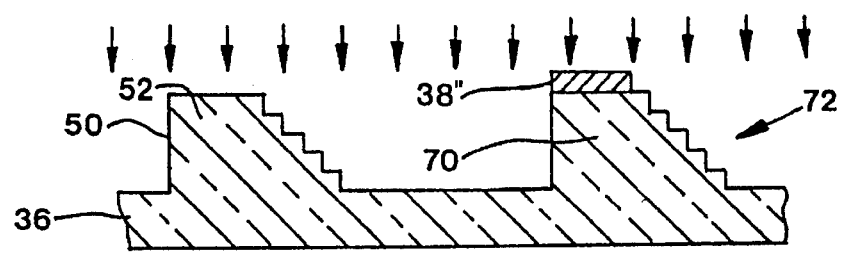
FIGS. 8A–8B are schematic cross sectional views illustrating a photomask constructed in accordance with the alternate embodiment in use during a photopatterning process.
Figure 8B:
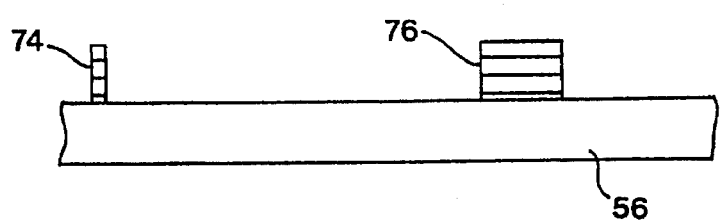

With reference to FIGS. 8A and 8B, during a photolithographic process a photomask 72 formed as shown in FIGS. 7A and 7B is used to pattern a semiconductor wafer 56 covered with positive resist. Using this photomask 72, a thin line 74 will be produced on the wafer 56 by the chromeless phase shifter 52. At the same time a thick line 76 will be produced by the opaque feature 38' formed on the photomask 72.

Thus the invention provides an improved method for forming chromeless phase shifting photomasks and for preventing the formation of undesirable stringers during photolithography. While the method of the invention has been described with reference to certain preferred embodiments, as will be apparent to those skilled in the art, certain changes and modifications can be made without departing from the scope of the invention as defined by the following claims.

What is claimed is:

1. A method for forming a chromeless phase shifting photomask comprising:

forming a pattern of features on a transparent substrate said features having sidewalls and a terminating edge;

forming a layer of resist over one sidewall and the terminating edge of the features;

forming a vertical edge in the substrate along one sidewall of each feature to a predetermined depth into the substrate;

forming a tapered edge in the substrate along the sidewall covered with resist and along the terminating edge, said tapered edge extending with a predetermined slope into the substrate to the predetermined depth;

stripping the resist; and stripping the pattern of features to form raised phase shifters each having a vertical edge on one side and a tapered edge along one side and the terminating edge, with the slope of the tapered edge selected to prevent null formation during a lithographic process utilizing the photomask.

2. The method as recited in claim 1 and wherein the features are formed of an opaque material.

3. The method as recited in claim 1 and wherein the tapered edge is formed as a stair step by etching the substrate with a first etching species followed by etching the resist with a second etching species.

4. The method as recited in claim 1 and wherein the tapered edge is formed as a smooth surface by combining a first etching species for etching the resist and second etching species for etching the substrate.

5. The method as recited in claim 1 and wherein the slope of the tapered edge is less than about 45°.

6. A method of forming a chromeless phase shifting photomask comprising:

forming a pattern of opaque features on a transparent substrate each opaque feature including a pair of sidewalls with a terminating edge therebetween;

depositing a layer of photoresist over the substrate and opaque features and patterning the photoresist such that one sidewall of each feature is exposed and one sidewall and a terminating edge of each feature are covered with photoresist;

isotropically etching the photoresist to expose portions of the surface of the substrate;

etching the exposed portions of the substrate to form a tapered edge extending from the photoresist adjacent to the covered sidewall and wrapping around the terminating edge, said tapered edge extending into the substrate at a predetermined slope and to a predetermined depth, said predetermined slope selected to prevent null formation during a lithographic process using the photomask;

etching the substrate along the exposed sidewall of the feature to form a vertical edge to the predetermined depth into the substrate;

stripping the photoresist; and stripping the opaque features to form chromeless phase shifters having vertical edges for forming nulls on a wafer during a lithographic process and a tapered edges to prevent formation of nulls.

7. The method as recited in claim 6 and wherein a thickness "t" of the chromeless phase shifters is determined by the formula $t = i\lambda/2(n-1)$ where $i$=an odd integer, $\lambda$=wavelength of exposure light and $n$=refractive index of the transparent substrate at an exposure wavelength.

8. The method as recited in claim 6 and wherein the opaque features are formed of a material selected from the group of materials consisting of chrome, aluminum, iron oxide, tungsten and gold.

9. The method as recited in claim 6 and further comprising using the photomask in the lithographic process to pattern a semiconductor wafer covered with a layer of resist.

10. The method as recited in claim 6 and wherein the photoresist is isotropically etched using an etching gas selected from the group consisting of $O_2$, $N_2$ and an $O_2/N_2$ mixture.

11. The method as recited in claim 6 and wherein the substrate is quartz and the quartz is isotropically etched using a fluorine containing gas.

12. The method as recited in claim 6 and wherein the pattern of opaque features and layer of photoresist are laid out using computer aided design.

13. The method as recited in claim 6 and wherein the photoresist and substrate are etched separately to form the tapered edge as a stair step.

14. The method as recited in claim 6 and wherein the photoresist and substrate are etched simultaneously to form the tapered edge with a smooth surface.

15. The method as recited in claim 6 and wherein the predetermined slope is less than about 45°.

16. A method for forming a phase shifting photomask comprising:

forming a pattern of opaque features on a transparent substrate using a first write, said features including sidewalls and a terminating edge;

forming a first layer of photoresist over the substrate and opaque features and patterning the photoresist using a second write such that one sidewall of each feature is exposed and one sidewall and the terminating edge of each feature are covered with photoresist;

etching the photoresist to expose portions of the surface of the substrate;

etching the exposed portions of the substrate to form a tapered edge extending from an edge of the photoresist into the substrate said tapered edge formed with a predetermined depth and with a predetermined slope selected to prevent null formation during a lithographic process using the photomask;

etching the substrate along the exposed sidewall of the feature to form a vertical edge to the predetermined depth into the substrate;

stripping the first layer of photoresist;

forming a second layer of photoresist on selected opaque features during a third write;

stripping the opaque features not covered by the second layer of photoresist to form chromeless phase shifters having a vertical edge for forming a null on a wafer during a lithographic process and the tapered to prevent formation of the null; and stripping the second layer of photoresist to form phase shifters having an opaque feature.

17. The method as recited in claim 16 and further comprising using the photomask during a lithographic process to pattern a resist covered wafer with runners having different widths.

18. The method as recited in claim 16 and wherein the first write, the second write and the third write are laid out using a computer aided design.

19. The method as recited in claim 16 and wherein the photoresist and substrate are etched separately to form the tapered edge as a stair step.

20. The method as recited in claim 16 and wherein the photoresist and substrate are etched simultaneously to form the tapered edge with a smooth surface.

* * * * *

UNITED STATES PATENT AND TRADEMARK OFFICE
CERTIFICATE OF CORRECTION

PATENT NO. : 5,487,962
DATED : Jan. 30, 1996
INVENTOR(S) : J. Brett Rolfson

It is certified that error appears in the above-indentified patent and that said Letters Patent is hereby corrected as shown below:

On the title page, insert the following:

Assignee: Micron Technology, Inc.
Boise, Idaho

Attorney, Agent, or Firm - Stephen A. Gratton

Signed and Sealed this

Fourteenth Day of May, 1996

*Attest:*

BRUCE LEHMAN

*Attesting Officer*     *Commissioner of Patents and Trademarks*